United States Patent [19]
Cobb et al.

[11] Patent Number: 5,519,573
[45] Date of Patent: May 21, 1996

[54] I/O RISER CARD FOR MOTHERBOARD IN A PERSONAL COMPUTER/SERVER

[75] Inventors: Lane C. Cobb, Ridgefield, Wash.; Gregory M. Kuzmanich, Portland, Oreg.

[73] Assignee: Intel Corporation, Santa Clara, Calif.

[21] Appl. No.: 364,803

[22] Filed: Dec. 27, 1994

[51] Int. Cl.⁶ .................................................. H05K 7/04
[52] U.S. Cl. ..................... 361/686; 361/736; 361/796; 361/683; 439/61
[58] Field of Search .................................... 361/679, 683, 361/684, 686, 736, 818, 796, 797, 728, 740, 741, 747; 439/61, 62, 64, 540.1, 541.5; 364/708.1; G06F 1/16

[56] References Cited

U.S. PATENT DOCUMENTS

| | | | |
|---|---|---|---|
| 5,208,734 | 5/1993 | Someno | 361/736 |
| 5,388,995 | 2/1995 | Rudy, Jr. et al. | 439/61 |
| 5,406,453 | 4/1995 | Cusato et al. | 361/733 |

Primary Examiner—Leo P. Picard
Assistant Examiner—Lynn D. Hendrickson
Attorney, Agent, or Firm—Owen L. Lamb

[57] ABSTRACT

A computer having a motherboard moused in a chassis having a bottom panel and a rear panel perpendicular to the bottom panel. The rear panel has a cutout therein. The motherboard is secured to the chassis in parallel with the bottom panel. The motherboard has a socket, such as a single in-line memory module (SIMM) socket. The I/O riser card is mounted in the socket perpendicular to the motherboard. An I/O riser card has connectors such as Standard 9 pin D-Sub, 25 pin D-Sub, Keyboard/Mouse Mini DIN, SCSI 2, wide SCSI and Pin Connectors mounted on the I/O riser. The connectors are mounted perpendicular to the I/O riser card such that the connectors are aligned with the cutout in the rear panel. The connectors are grounded to the chassis with an electromagnetic interference (EMI) gasket contoured to the cutout.

6 Claims, 2 Drawing Sheets

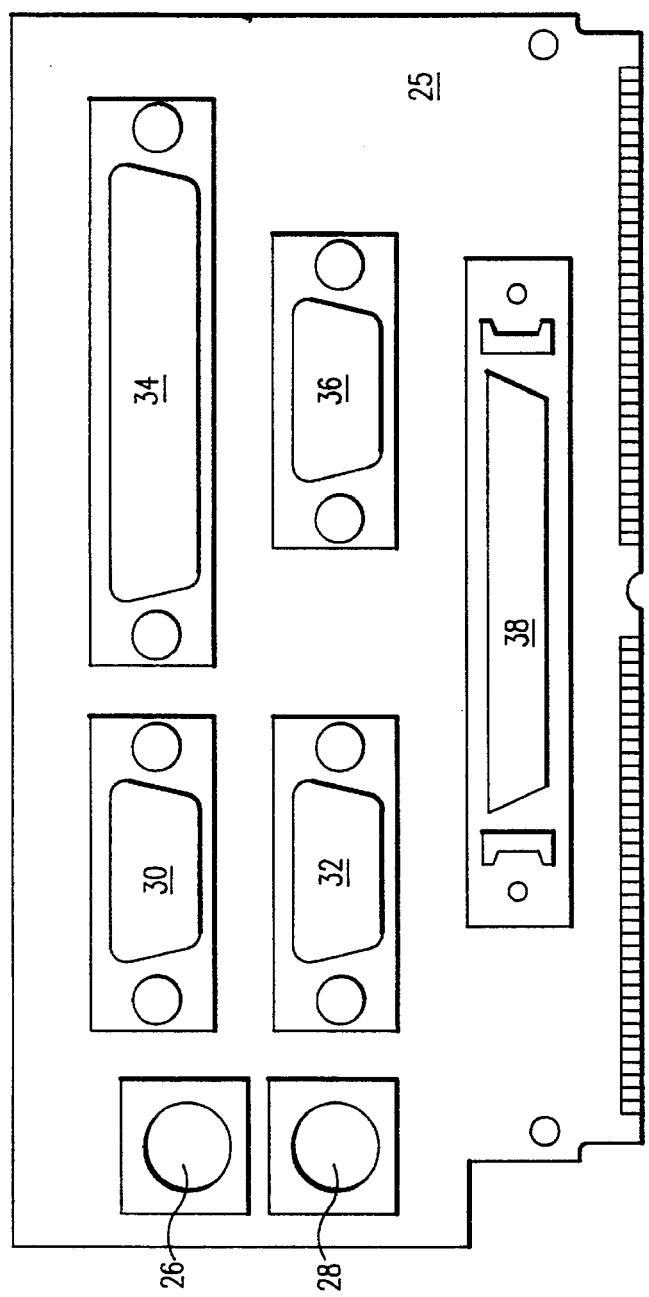

I/O RISER CARD FOR MOTHERBOARD IN A PERSONAL COMPUTER/SERVER

BACKGROUND OF THE INVENTION

1. Field of the Invention

The present invention is related to personal computers and more particularly to an apparatus that provides cable connectors to the chassis of the computer.

2. Background Art

A personal computer is a stand-alone desktop computer housed in a chassis which is a cover that protects the computer components from the environment. Input/output (I/O) devices, such as a video monitor, mouse and printer are connected to a back panel of the chassis by means of cables that plug into connectors at a back panel of the chassis. Inside the chassis is a system board, called a motherboard, that holds the electronic components of the computer. In past designs, the connectors at the back panel are mounted directly on the motherboard. The motherboard has printed circuit wiring that distributes the I/O signals from the back panel connectors to appropriate components on the motherboard.

Many different computer equipment manufacturers assemble their products from components supplied to them by suppliers that have the ability to manufacture printed circuit boards, such as motherboards. This results in many different motherboard designs to fit the requirements of many different chassis designs and I/O connector configurations from the motherboard to the outside of the chassis. This means that a supplier needs to design, manufacture, and stock several different motherboard assemblies in order to accommodate the many different I/O connector requirements of its customers.

It is therefore desirable from a supplier's point of view to have one motherboard design that fits the specific needs of many different customers.

SUMMARY OF THE INVENTION

Briefly, the invention is concerned with a computer having a motherboard housed in a chassis having a bottom panel and a rear panel perpendicular to the bottom panel. The rear panel has cutouts therein to accommodate several I/O connectors. The motherboard is secured to the chassis in parallel with the bottom panel. The motherboard has a socket with an I/O riser card being mounted in the socket perpendicular to the motherboard. The I/O riser card has connectors such as video monitor, mouse and printer connectors mounted on the I/O riser card. The connectors are mounted perpendicular to the I/O riser card such that the connectors are aligned with the cutouts in the rear panel. The connectors are secured and grounded to the chassis with an electromagnetic interference (EMI) gasket contoured to the cutouts.

The invention has the advantage that it allows a single motherboard design to fit in many different chassis designs without the need to change the motherboard or chassis. By using different I/O riser cards with the motherboard, the requirements of many different system designs can be met with a single motherboard design.

The invention has the advantage that it provides a flexible and cost effective solution for different I/O connector configurations from a computer motherboard to the outside of the chassis.

The invention has the advantage that it reduces the need to design, manufacture and stock several different motherboard assemblies which saves a supplier of motherboards and its customers money and gives the supplier's motherboards a competitive advantage in the market place.

The invention has the advantage that the I/O riser card design allows more I/O connectors to be utilized than motherboard-mounted connector designs.

BRIEF DESCRIPTION OF THE DRAWINGS

FIG. 2 is a front view of an I/O riser card that mates with a socket on the motherboard shown in FIG. 1; and FIG. 3 is side view of the I/O riser card shown in FIG. 2.

DESCRIPTION OF THE PREFERRED EMBODIMENT

Figure 1:
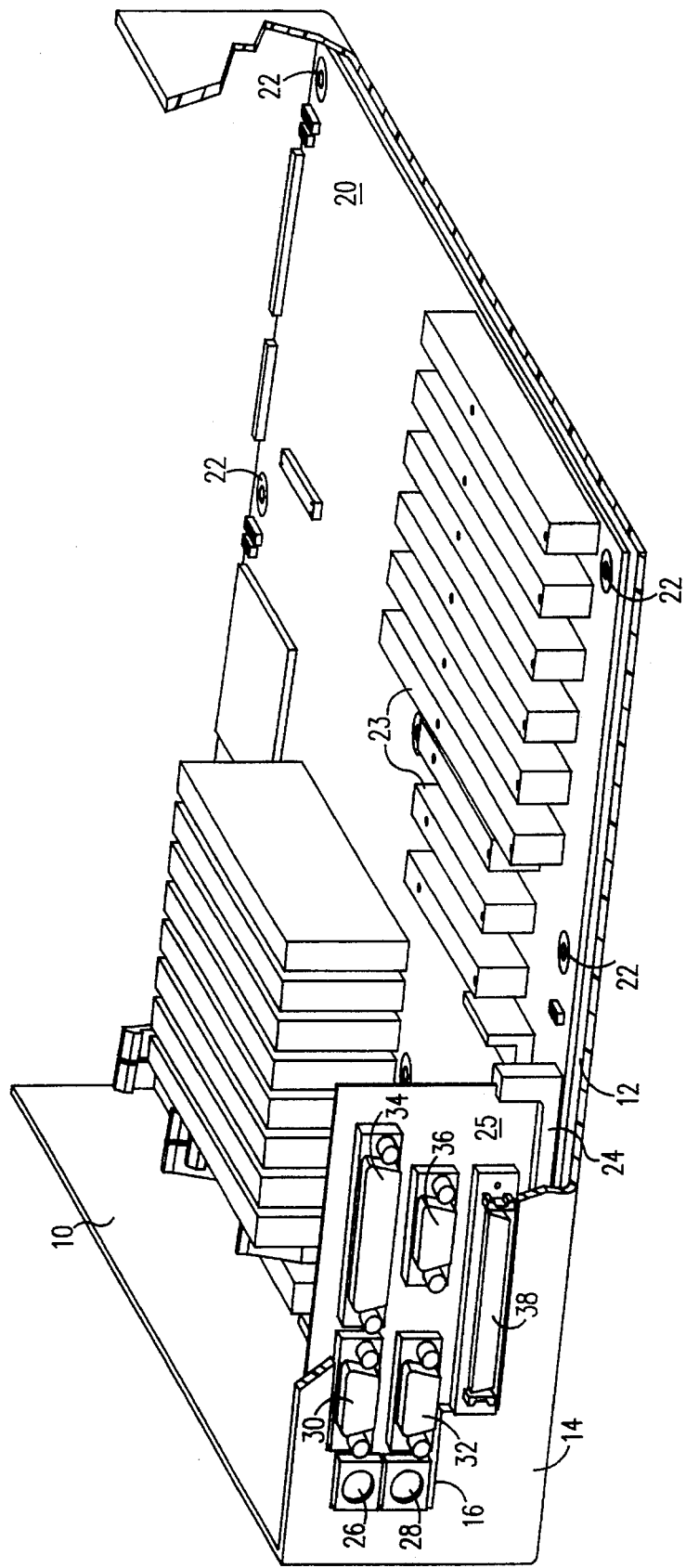
FIG. 1 is a rear view of a computer system in which the present invention is embodied.

Refer to FIG. 1 which is a rear view of a computer system in which the present invention is embodied. The computer is shown with its top cover removed and the chassis partially broken away.

A computer is housed in a chassis (10) having a bottom panel (12) and a rear panel (14) substantially perpendicular to the bottom panel. The rear panel has cutouts (16) to accommodate connectors that connect the computer electronics to peripheral devices. A large printed circuit board at the bottom of the chassis, called a system board or motherboard (20), holds the computer's control circuitry and other electronics. The motherboard (20) is secured to the chassis substantially in parallel with the bottom panel (12) by fasteners (22). Hardware options in the form of printed circuit cards are plugged directly into expansion slots (23) on the motherboard.

The mother board (20) includes a socket (24). An I/O riser card (25), a small printed circuit board, is mounted in the socket (24) substantially perpendicular to the motherboard (20). The I/O riser card has a keyboard connector (26), a mouse connector (28), a serial port 1 connector (30), a serial port 2 connector (32), a parallel port connector (34), and a video connector (36) and a small computer system interface (SCSI) connector (38) mounted on the I/O riser card. The connectors are mounted perpendicular to the I/O riser card. The connectors on the I/O riser card are aligned with cutouts (16) in the rear panel. An electromagnetic interference (EMI) gasket (40) contoured to the cutouts grounds the connectors to the chassis.

The socket (24) may be, for example, a 144-connector single in-line memory module II (SIMM II) dual read-out socket. The connectors on the I/O riser card may include one or more of the following: a Standard 9 pin D-Sub, 25 pin D-Sub, Keyboard/Mouse Mini DIN, SCSI 2, wide SCSI and Pin Headers mounted on the I/O riser card.

Those skilled in the art will realize that as new connector designs are introduced they may be incorporated into the I/O riser card without having to redesign the motherboard.

While the invention has been particularly shown and described with reference to preferred embodiments thereof, it will be understood by those skilled in the art that the foregoing and other changes in form and detail may be made therein without departing from the scope of the invention.

What is claimed is:

1. A computer comprising:

a mother board;

a chassis having a bottom panel and a rear panel substantially perpendicular to said bottom panel;

said rear panel having a cutout therein;

said mother board being secured to said chassis substantially in parallel with said bottom panel;

an I/O riser card;

said I/O riser card including a printed circuit board;

said mother board including a socket;

said I/O riser card being mounted in said socket substantially perpendicular to said motherboard;

said I/O riser card including a connector mounted on said I/O riser card;

said connector being mounted perpendicular to said I/O riser card;

said connector on said I/O riser card being aligned with said cutout in said rear panel.

2. The computer in accordance with claim 1 further comprising:

an electromagnetic interference (EMI) gasket contoured to said cutout;

said connector being grounded to said chassis with said electromagnetic interference (EMI) gasket.

3. The computer in accordance with claim 1 wherein said socket is a multi-connector single in-line memory module (SIMM) socket.

4. In a computer a chassis having a bottom panel and a rear panel substantially perpendicular to said bottom panel, said rear panel having a cutout therein, an apparatus comprising:

a mother board;

said mother board including fasteners that are useable to secure said motherboard to said chassis substantially in parallel with said bottom panel;

an I/O riser card;

said I/O riser card including a printed circuit board;

said mother board including a socket;

said I/O riser card being mounted in said socket substantially perpendicular to said motherboard;

said I/O riser card including a connector mounted on said I/O riser card;

said connector being mounted perpendicular to said I/O riser card;

said connector on said I/O riser card being placed on said riser in such a position that said connector aligns with said cutout in said rear panel.

5. The computer in accordance with claim 4 further comprising:

an electromagnetic interference (EMI) gasket contoured to said cutout;

said connector being grounded to said chassis with said electromagnetic interference (EMI) gasket.

6. The computer in accordance with claim 4 wherein said socket is a multi-connector single in-line memory module (SIMM) socket.

\* \* \* \* \*